United States Patent [19]

Seki et al.

[11] Patent Number: 5,000,816
[45] Date of Patent: Mar. 19, 1991

[54] THIN FILM PEELING APPARATUS

[75] Inventors: Mitsuhiro Seki, Tokyo; Shigeo Sumi, Saitama, both of Japan

[73] Assignee: Somar Corporation, Tokyo, Japan

[21] Appl. No.: 342,827

[22] Filed: Apr. 25, 1989

[30] Foreign Application Priority Data

Apr. 25, 1988 [JP] Japan .................... 63-101909

[51] Int. Cl.$^5$ ............................................ B32B 31/18
[52] U.S. Cl. .................................. 156/584; 156/344; 271/97; 430/256
[58] Field of Search .................. 156/344, 584; 271/97, 271/280; 430/256

[56] References Cited

U.S. PATENT DOCUMENTS

| | | | |
|---|---|---|---|
| 4,685,991 | 8/1987 | Herrmann et al. | 156/344 |
| 4,724,032 | 2/1988 | Kay | 156/344 |
| 4,908,093 | 3/1990 | Sumi | 156/584 |

*Primary Examiner*—Robert A. Dawson
*Attorney, Agent, or Firm*—Sughrue, Mion, Zinn, Macpeak & Seas

[57] ABSTRACT

A thin film peeling apparatus in which a portion of a thin film adhered to a base plate is initially lifted and subsequently peeled therefrom. The film peeling apparatus includes a conveying device for conveying the base plate along a base plate conveyance path, a first thin film conveyance device for conveying the lifted portion of the thin film and a second thin film conveyance device for subsequently conveying the thin film. The first thin film conveyance device is disposed so that the thin film is peeled in a direction substantially perpendicular to the direction of conveyance of the base plate. The second thin film conveyance device includes at least one fluid ejector for ejecting fluid against the thin film such that the thin film is conveyed in a direction parallel to the surface of the base plate and substantially perpendicular to the direction of conveyance of the base plate.

9 Claims, 12 Drawing Sheets

THIN FILM PEELING APPARATUS

BACKGROUND OF THE INVENTION

The present invention relates to an art of peeling a thin film from a base plate and discharging the peeled film.

In a printed circuit board for an electronic appliance such as a computer, wirings are made of copper or the like in a prescribed pattern on at least one side of an electrically insulating base plate. The printed circuit board is manufactured in a process described below. A stratified body consisting of a photosensitive resin layer and a light-transmissible resin film, which is a cover film for protecting the resin layer, is first adhered, under heat and pressure, to an electroconductive layer on the electrically insulating base plate. A wiring pattern film is then overlaid on the stratified body. The photosensitive resin layer is exposed to light through the wiring pattern film and the cover film for a prescribed time. The pattern film and the cover film are thereafter removed. The photosensitive resin layer is then developed so that an etching pattern mask is formed. Thereafter, the unnecessary portion of the electroconductive layer is removed by etching, and the remaining portion of the photosensitive resin layer is also removed. The printed circuit board having the wirings in the prescribed pattern is thus manufactured. In the process of manufacturing the printed circuit board, the cover film needs to be peeled from the photosensitive resin film before the resin film exposed to the light is developed. Since the peeling is performed by a human hand and the film is thin, the person needs to be dextrous and skilled enough to prevent the photosensitive resin film from being damaged or destroyed due to stress concentration or the like in the peeling. For that reason, an automatic thin film peeling machine for automatically peeling the cover film was developed. In the machine, a portion of the cover film of the stratified body adhered to the base plate is automatically lifted up by a needle, a brush, a knurled instrument or the like, and a fluid is then automatically blown onto the lift-up portion to peel the whole cover film. The cover film peeled by the fluid blown onto it is temporarily held on a peeling direction setting plate so that the cover film is thereafter entirely peeled from the base plate while being conveyed by a thin film conveyor including two conveyance belts which pinch the cover film in order to peel and convey the film. The thin film conveyor is coupled to the automatic thin film peeling machine or built therein. The cover film peeled and conveyed by the conveyor is discharged into a discharged thin film container.

An automatic thin film peeling machine disclosed in the Japanese Application No. 38880/86 made by the present applicant has an upper and lower discharged thin film containers over and under a base plate conveyance passage, respectively. A cover film peeled from the lower side of a base plate is discharged into the lower discharged thin film container, while a cover film peeled from the upper side of the base plate is discharged into the upper discharged thin film container. Since the thin film containers are disposed in a three-dimensional manner, the machine is compact. The upper cover film peeled from the upper side of the base plate is conveyed to the upper inlet opening of the upper discharged thin film container by the conveyance belt units of a thin film conveyor, and thereafter discharged into the container. The upper cover film is pinched between the conveyance belt units while being conveyed by them. Since the conveyance belt units are made long enough to correspond to the height of the upper discharged thin film container, a small tension difference is likely to occur between conveyance belts facing each other across the cover film, to often cause the film to undergo improper conveyance such as jamming. This is a problem. Since the upper discharged thin film container is located above the base plate conveyance passage it is troublesome and inefficient to handle the container to perform the dumping of the discharged cover film or do the like. This is another problem. If the upper discharged thin film container is made of a metal such as stainless steel, the container is heavy enough to greatly increase the problems and the inefficiency.

In order to solve the problems, the thin film conveyor of an automatic thin film peeling machine disclosed in the Japanese Patent Application No. 315552/87 made by the present applicant was developed. A cover film from the upper side of a base plate is conveyed and discharged by the first and second conveyance belt units of the thin film conveyor. The cover film is conveyed by the first conveyance belt unit while being pinched and peeled by the belt unit. The cover film is conveyed by the second conveyance belt unit while not being pinched by the belt unit but supported thereon. The second conveyance belt unit conveys the cover film in a direction extending across the direction of conveyance of the base plate. As a result, the automatic thin film peeling machine has feature that the length of the first conveyance belt unit which would be likely to cause the cover film to undergo improper conveyance is reduced. Since the second conveyance belt unit conveys the cover film in the direction extending across that of conveyance of the base plate, an upper discharged thin film container can be located in a relatively low position near the place where the conveyance of the cover film ends. For that reason, the machine has a feature that the upper discharged thin film container can be efficiently handled to perform the dumping of the discharged cover film or do the like.

Since each of the first and second conveyance belt units of the thin film conveyor of the automatic thin film peeling machine disclosed in the Japanese Patent Application No. 315552/87 is made of a plurality of rollers, a plurality of belts, a roller driver and so forth, the constitution of the conveyor is complicated. For that reason, the cost of manufacturing of the machine is high, and it is difficult to perform maintenance work on the machine. This is a problem. Since the second conveyance belt unit is made of reticulate belts and toothed rollers for revolving the belts, the problem arises markedly for the second conveyance belt unit.

SUMMARY OF THE INVENTION

The present invention was made in order to solve the problems.

Accordingly, it is an object of the present invention to provide an art in which the impropriety of conveyance of a thin film peeled from a base plate in a thin film peeling machine, which conveys the film while peeling it from the plate and then discharges the peeled film, is reduced and the construction for the reduction is simplified.

It is another object of the present invention to provide an art in which the impropriety of conveyance of a thin film peeled from a base plate in a thin film peeling machine, which conveys the film while peeling it from the plate and then discharges the peeled film, is reduced, the construction for the reduction is simplified, the cost of the machine is diminished and the maintenance work thereon is easily performed.

It is still another object of the present invention to provide an art in which the impropriety of conveyance of a thin film peeled from a base plate in a thin film peeling machine, which conveys the film while peeling it from the plate and then discharges the peeled film into a discharged thin film container, is reduced through a simple construction and the efficiency of handling of the container is enhanced.

It is yet another object of the present invention to provide an art in which a discharged thin film container is made compact.

The above-mentioned and other objects and novel features of the present invention will be apparent from the description herein and the drawings attached hereto.

A thin film peeling machine provided in accordance with the present invention peels a portion of a thin film from a base plate to thereafter peel the whole thin film from the plate, and then discharges the peeled thin film. The machine includes a first thin film conveyance means, by which the peeled portion of the thin film is pinched to peel the whole thin film from the base plate and convey the film upward over the base plate, and a second thin film conveyance means by which a fluid is blown so that the thin film conveyed by the first thin film conveyance means is conveyed in a direction extending across that of conveyance of the base plate.

Since the length of the first thin film conveyance means for conveying the thin film while pinching it is diminished by that of the second thin film conveyance means for conveying the thin film conveyed by the first thin film conveyance means, the impropriety of the conveyance of the thin film in a thin film discharge passage is reduced. Since the second thin film conveyance means is chiefly made of a fluid blowing unit for blowing the fluid to the thin film, a large number of components such as rollers and belts are not needed. For that reason, the number of components of the second thin film conveyance means is decreased and the constitution of the means is simplified.

DETAILED DESCRIPTION OF THE PREFERRED EMBODIMENTS

Figure 1:
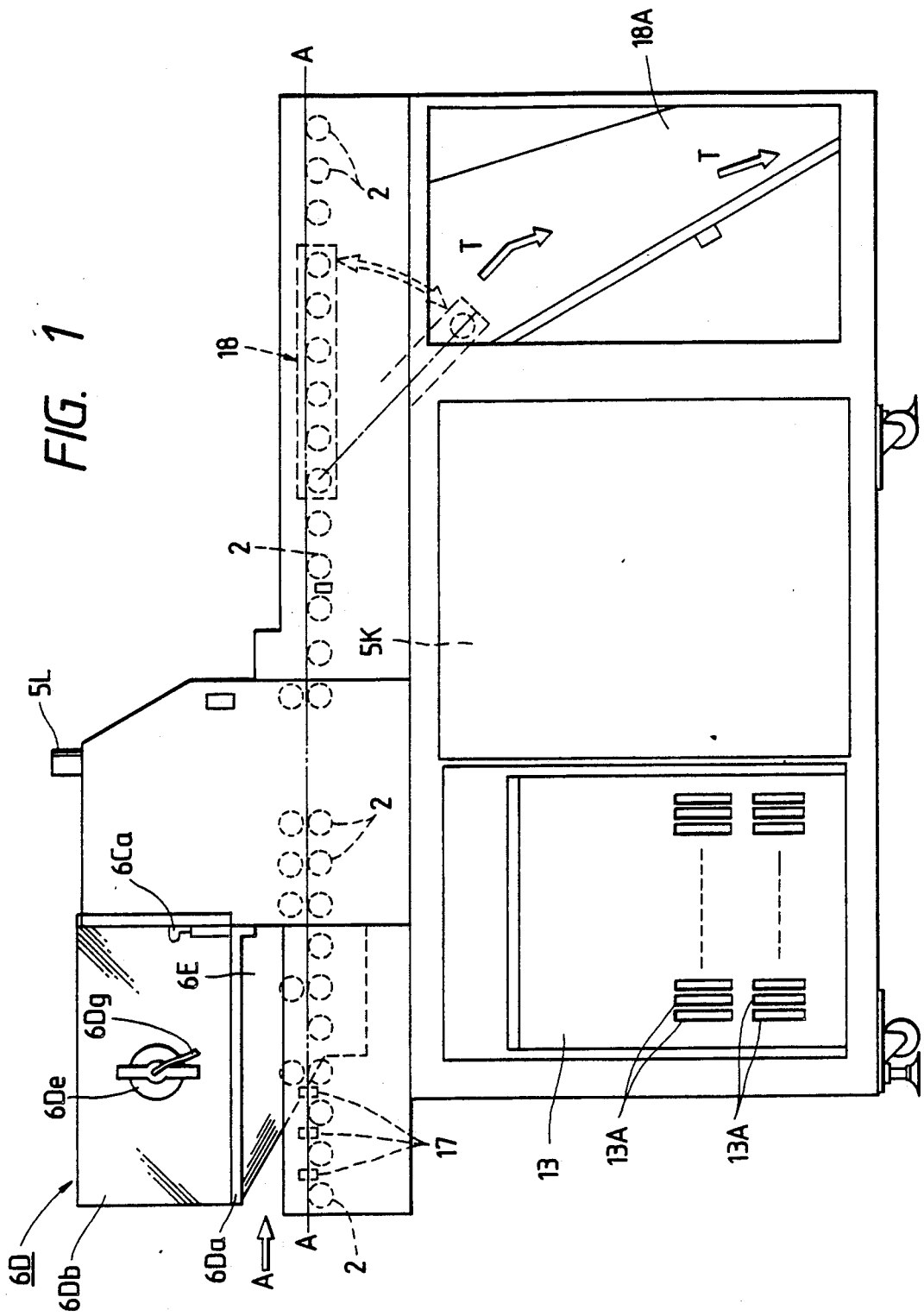
FIG. 1 shows a side view of a cover film peeling machine which is for a printed circuit board and is an embodiment of the present invention.

Embodiments of the present invention are hereafter described with reference to the drawings attached hereto. The mutually equivalent portions shown in the drawings are denoted by the same reference symbols therein.

Figure 2:
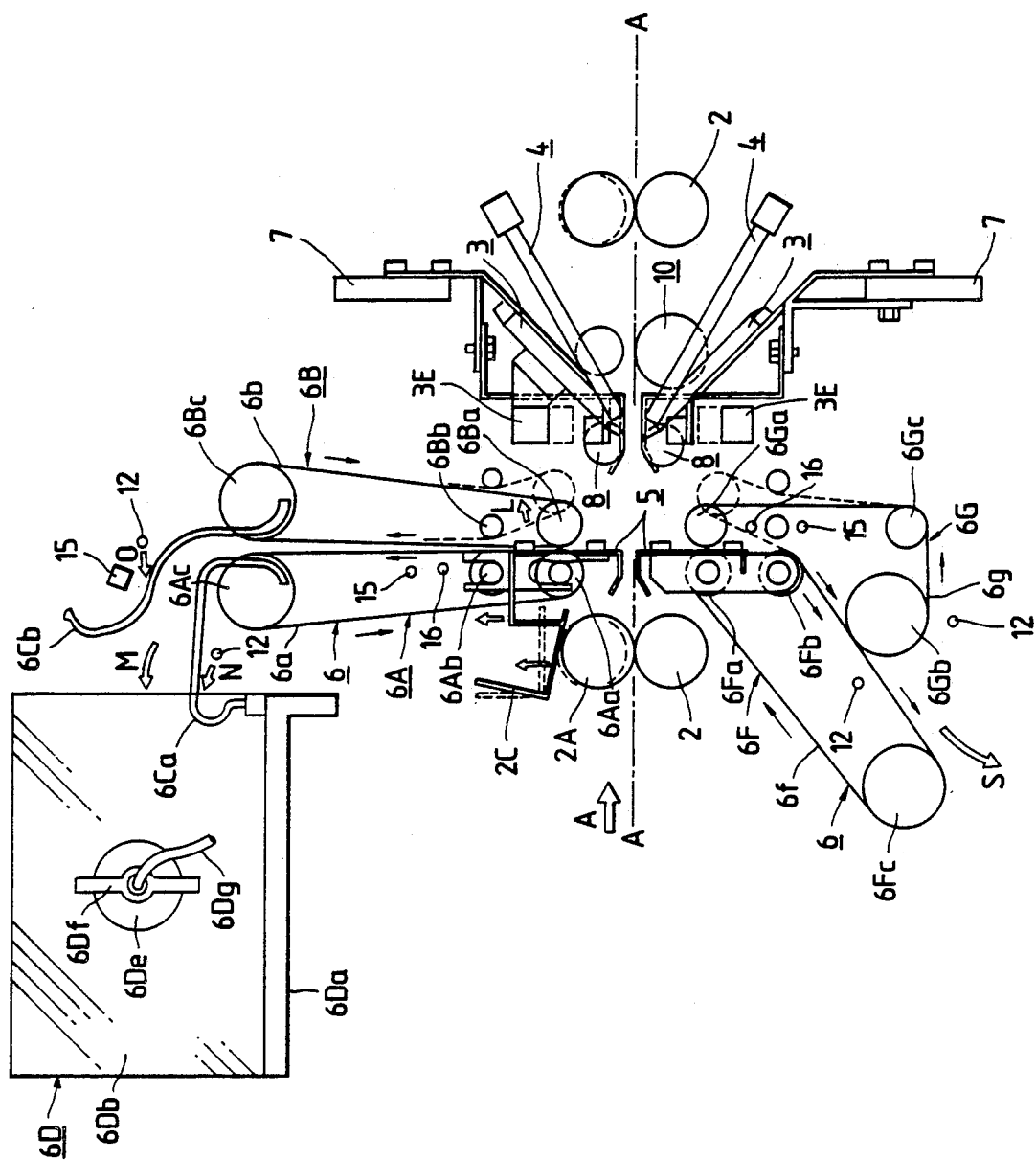
FIG. 2 shows an enlarged view of a major part of the machine.

FIG. 1 shows a side view of a cover film peeling machine which peels a cover film from a printed circuit board. FIG. 2 shows an enlarged view of a major part of the cover film peeling section of the machine. The printed circuit board conveyor portion of the machine primarily includes conveyance drive rollers 2 for conveying the printed circuit board 1. A thin film lift-up unit 3, fluid blowers 4, peeling direction setting plates 5, which assist in peeling the cover films from the upper and lower sides of the printed circuit board 1, and a thin film conveyor 6, which discharges the peeled cover films, are provided along a printed circuit board conveyance passage A—A in the printed circuit board conveyor, above and below the passage, as shown in FIG. 2.

Figure 5:
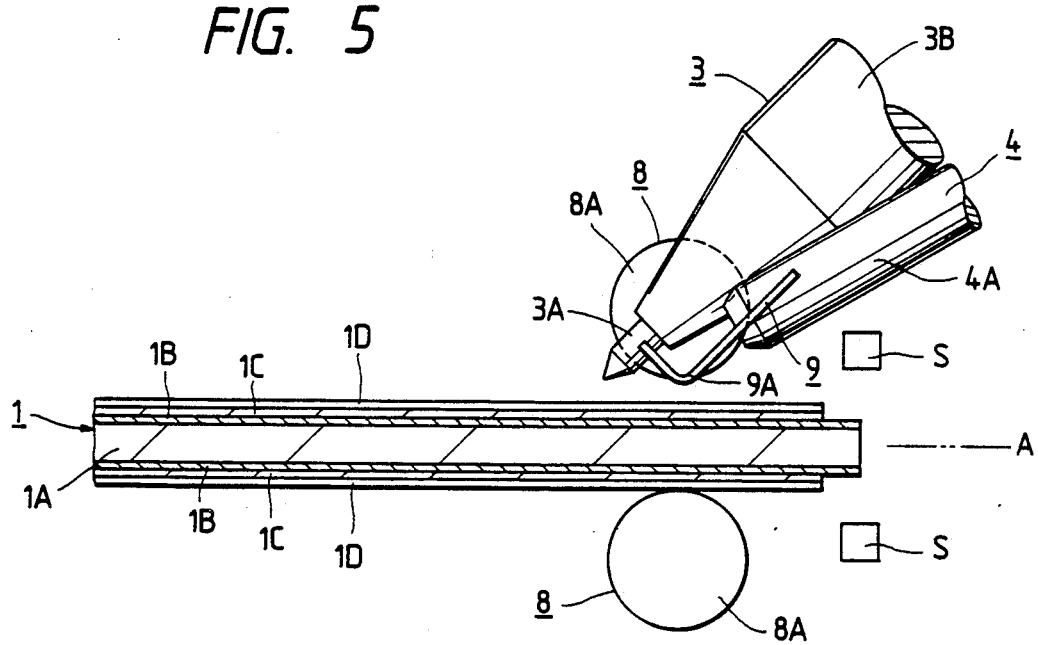
FIGS. 5, 6, 7, 8 and 9 show enlarged sectional views of a major part of the machine in the steps of peeling operation thereof.

As shown in FIG. 5, the printed circuit board 1 comprises an electrically insulating base plate 1A and electroconductive layers 1B made of copper or the like on both the sides of the plate. A stratified body consisting of a photosensitive resin layer 1C and the cover film 1D. which is a protective thin film, is adhered, under heat and pressure, to each electroconductive layer 1B on the printed circuit board 1 in advance. Before the printed circuit board 1 is conveyed to the position of the peeling of the cover film 1D. the photosensitive resin layer 1C is exposed to light through a prescribed wiring pattern film overlaid on the cover film. The printed circuit board 1 is conveyed to the cover film peeling position, by the conveyance drive roller 2, in a direction A shown in FIGS. 1 and 2.

Figure 3:
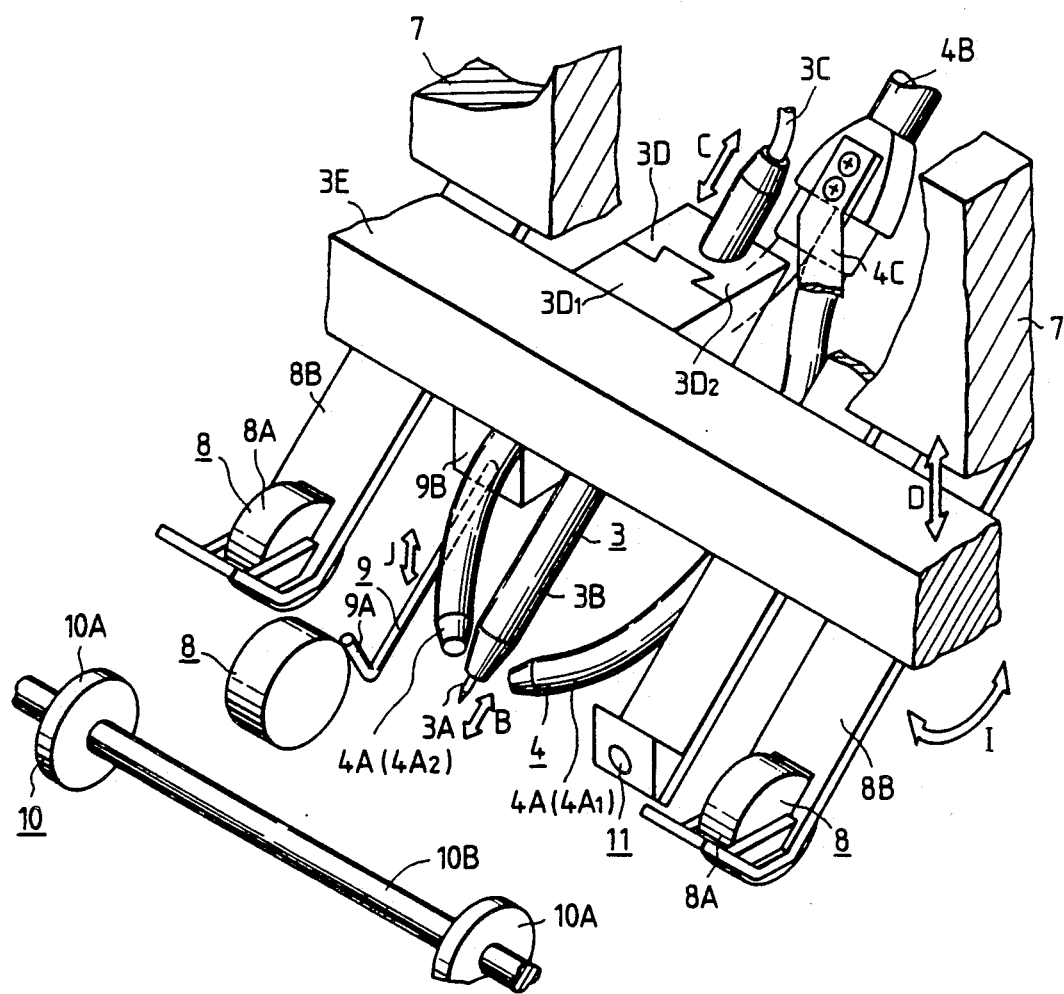
FIG. 3 shows an enlarged perspective view of a major part of the machine.
Figure 4:
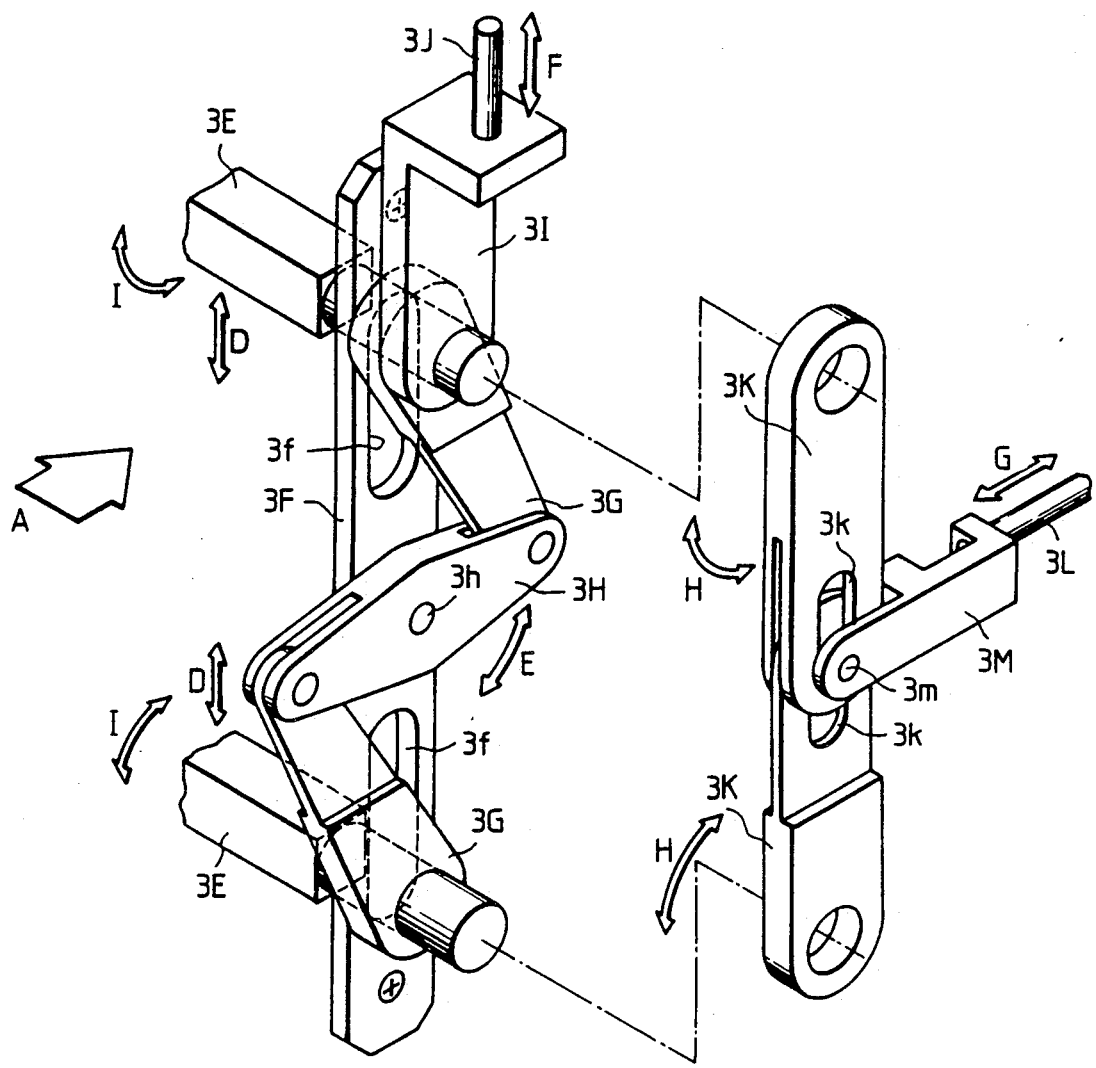
FIG. 4 shows an enlarged exploded perspective view of a major part of the machine.

Each thin film lift-up unit 3 is constituted as shown in FIGS. 2, 3 and 4. The unit 3 includes at least one lift-up member 3A for the corresponding side of the printed circuit board 1. The member 3A has a needle-like tip oriented toward the side of the printed circuit board 1, and is vibrated in directions B by a pneumatic vibrator 3B which is supplied with pressurized air through a fluid feed pipe 3C to vibrate the lift-up member 3A at the frequency of 2,000 to 3,000 times per minute. The tip of the lift-up member 3A acts to apply vibratory pushing energy to the end of the stratified body on the printed circuit board 1 to pick up the cover film 1D from the photosensitive resin layer 1C at the end of the body in order to peel the cover film from the resin layer. Since the adhesive power between the photosensitive resin layer 1C and the electroconductive layer 1B is higher than that between the cover film 1C and the photosensitive resin layer, the resin layer is not peeled from the electroconductive layer by the vibratory pushing energy. The angle of the tip of the lift-up member 3A to the printed circuit board 1 is set at about 60° to 70°. The surface of the tip of the member 3A has an appropriate radius of curvature as to not damage the electroconductive layer 1B and the stratified body, especially the photosensitive resin layer 1C. The tip of the member 3A is made of a metal such as stainless steel and carbon steel or a nonmetallic material such as ceramic so that tip wear is minimized.

The pneumatic vibrators 3B coupled to the lift-up members 3A provided in vertically symmetric positions above and below the printed circuit board conveyance passage A—A are individually supported with holders 3D on rotary support shafts 3E. Each holder 3D comprises a fixed holding member $3D_1$ and a slidable holding member $3D_2$. The fixed holding member $3D_1$ is secured to the rotary support shaft 3E. The slidable holding member $3D_2$ is constituted to hold the lift-up member 3A and the pneumatic vibrator 3B at a prescribed angle to the printed circuit board conveyance passage A—A. The slidable holding member $3D_2$ can be slid in direction C relative to the fixed holding member $3D_1$ or the rotary support shaft 3E so as to place the lift-up member 3A into contact with the stratified body under a prescribed vibratory pushing force. The sliding of the slidable holding member $3D_2$ in the direction C is controlled by an elastic member such as a spring (not shown).

As shown in FIG. 4, at least one end of each rotary support shaft 3E for the lift-up member 3A is rotatably coupled to one end of a movable arm 3G through the slotted guide hole 3f of a guide member 3F which is secured to the body 7 of the cover film peeling machine by an attaching means such as a screw (not shown). The slotted guide hole 3f acts to guide the rotary support shaft 3E and the lift-up member 3A in such directions as to move the shaft and the member toward and away from the printed circuit board 1. The other ends of the upper and the lower movable arms 3G are rotatably attached to the ends of a rotary shaft 3h across which the ends of the rotary arm are opposed to each other. The rotary arm 3H acts to move the upper and the lower movable arms 3G in the mutually different directions D. The shaft 3J of a driver for both the upper and the lower movable arms 3G is coupled to one end of the upper or lower rotary support shaft 3E by a coupling member 3I.

The guide members 3F for guiding the rotary support shafts 3E, the movable arms 3G, the rotary arm 3H and the driver constitute the linkage mechanism of the thin film lift-up unit 3 so that the lift-up members 3A disposed on both sides of the printed circuit board 1 are moved toward and away from each other by the linkage mechanism as the shaft 3J is moved in directions F. Each of the components of the linkage mechanism is made of a material such as iron, an aluminum alloy and a hard resin so as to be less likely to be deformed by an external force. The driver is made of a pneumatic cylinder, a hydraulic cylinder, an electromagnetic actuator or the like. The shaft 3J may not be coupled to the end of the movable arm 3G, but may be coupled to one end of the rotary arm 3H.

Since the lift-up members 3A are coupled to the driver through the linkage mechanism, both lift-up members can be moved into and out of contact with the surface of the printed circuit board in the directions D by the single driver. Since the guide members 3F, the movable arms 3G and the rotary arm 3H, which are the components of the linkage mechanism, are substantially rigid bodies and the ranges of action of the guide members and the arms are limited by the slotted guide holes 3f and the rotary shaft 3h, the quantities and durations of action of the lift-up members 3A for both sides of the printed circuit board 1 can be equally and accurately controlled. Further, since the linkage mechanism consists of only a few number of components whose constructions are simpler than a rack and pinion mechanism and a gear mechanism, the linkage mechanism which couples the lift-up members 3A to the driver is simpler in constitution than the latter.

Pick-up member rotation arms 3K are provided at one end or both ends of each of the upper and the lower rotary support shafts 3E fitted with the movable arms 3G, and are secured at one end of each of the rotary arms. The rotation arms 3K have slotted holes 3k at the other ends of the arms. The shaft 3m of a coupling member 3M conjoined to the shaft 3L of a driver provided for both the sides of the printed circuit board 1 extends through the slender holes 3k so that the lift-up member rotation arms 3K are coupled to the shaft 3L through the coupling members. The driver is made of a pneumatic cylinder, a hydraulic cylinder, an electromagnetic actuator or the like. The lift-up member rotation arms 3K, the coupling members 3M and the driver constitute the lift-up member rotation mechanism of the thin film lift-up unit 3 to rotate the arms in directions H and rotate the rotary support shafts 3E in directions I as the shaft 3L is moved in directions G. In other words, the lift-up member rotation mechanism acts to push the end of the stratified body in a vibratory manner by the lift-up member 3A and move the member by a prescribed distance in the direction of the conveyance of the printed circuit board 1. The distance is about 1 mm to 3 mm. As for the rotation mechanism, the upper and the lower lift-up members 3A for both sides of the printed circuit board 1 can be operated by the single driver and the quantities and durations of action of the lift-up members can be accurately controlled, as well as the above-mentioned linkage mechanism which is for moving the lift-up members toward and away from the printed circuit board. Further, the lift-up member rotation mechanism is simple in constitution for coupling the lift-up members 3A to the driver.

The thin film lift-up unit 3 comprises the lift-up members 3A, the pneumatic vibrators 3B, the linkage mechanism and the lift-up member rotation mechanism. The lift-up members 3A and the pneumatic vibrators 3B may be replaced with an electromagnetic vibrator disclosed int eh Japanese Patent Application No. 181126/86 made by the present applicant.

As shown in FIGS. 2 and 3, the fluid blower 4 includes a nozzle device 4A from which a pressurized fluid such as air, inert gas or water is sprayed. In this embodiment, air is used as the pressurized fluid. The fluid blower 4 acts so that the fluid is blown in the gap between the photosensitive resin layer 1C and the cover film 1D lifted up by the thin film lift-up unit 3, at the end of the printed circuit board 1. The nozzle device 4A is located near the lift-up member 3A to blow the fluid immediately into the gap. The nozzle device 4A consists of a pair of nozzles $4A_1$ and $4A_2$ to blow the fluid into the gap in two directions at both the sides of the tip of the lift-up member 3A. The fluid is supplied to the pair of nozzles $4A_1$ and $4A_2$ through a single fluid feed pipe 4B. The pair of nozzles $4A_1$ and $4A_2$ are secured to the body 7 of the cover film peeling machine by a support member 4C in such a manner that the direction of the blowing of the fluid from each nozzle is not changed by the minute vibration of the machine or the like. In other words, the direction of the blowing of the fluid from each nozzle is always fixed. Since the fluid is quickly blown into the gap between the photosensitive resin layer 1C and the cover film 1D by the thin film lift-up unit 3, the cover film is instantaneously and surely peeled from the photosensitive resin layer in a simple manner. SInce the nozzle means 4A of the fluid blower 4 consists of the pair of nozzles $4A_1$ and $4A_2$, the fluid is more accurately blown onto the portion of the cover film 1D, which is lifted up by the thin film lift-up unit 3 to more surely peel the cover film by the fluid.

The directions of the blowing of the fluid from the nozzles $4A_1$ and $4A_2$ to the cover film 1D may be made variable. For example, the fluid blower 4 may be constituted to move the nozzles $4A_1$ and $4A_2$ as close to the gap between the photosensitive resin layer 1C and the cover film 1D as possible before blowing the fluid in the gap, and to move the nozzles away from the gap after blowing the fluid in the gap to place the nozzles in positions in which the printed circuit board 1 does not come into contact with the nozzles.

As shown in FIGS. 1, 3 and 5, printed circuit board holders 8 and a stratified body end detector 9 are provided near the printed circuit board conveyance passage A—A so that the holders and the detector are located nearly on the same straight line extending across the passage. Each holder 8 comprises rollers 8A and support members 8B supporting the rollers at one end of each support member so that the rollers are rotatable. The other ends of the support members 8B are attached to the machine body 7 by securing means such as screws. The holders 8 are disposed in the area between the conveyance drive rollers 2, which is widened because the thin film lift-up unit 3 and the fluid blower are provided between the rollers. The holders 8 are located near the place where the vibratory pushing energy of the thin film lift-up unit 3 and the energy of the pressurized fluid blown from the fluid blower 4 act on the printed circuit board 1. Each of the rollers 8A is located to have such a prescribed gap to the cover film 1D on the printed circuit board 1 such that the board being conveyed is kept in the conveyance passage A—A and the cover film 1D is not pushed onto the roller by the fluid from the fluid blower but peeled from the photosensitive resin layer 1C by the fluid. The rollers 8A are made of a relatively soft material such as resin and rubber so as to not damage or destroy the stratified body, especially the photosensitive resin layer 1C, when the cover film 1D comes into contact with the rollers. The support members 8B not only support the rollers 8A but also act to keep the printed circuit board 1 in the conveyance passage A—A in cooperation with the rollers. The support members 8B are made of a relatively hard material such as hard resin and metal. Since the printed circuit board holders 8 are provided near the conveyance passage A—A and the lift-up members 3A of the thin film lift-up unit 3, the leading portion of the printed circuit board 1 is prevented from sagging, even if the board is thin, so that the board is surely kept in the conveyance path. For that reason, the printed circuit board 1 is prevented from experiencing problems such as jamming during the conveyance thereof, so that the board and the thin film peeling machine are protected from damage or destruction.

The stratified body end detector 9 is of such an electrostatic capacity type as to detect the change in electrostatic capacity, or of such an electric resistance type as to detect the change in electric resistance. The detector 9 primarily comprises contact rods 9A provided at both the sides of the printed circuit board 1, and movable support means 9B for supporting the rods. The contact rods 9A are made of an electroconductive material such as copper and steel, and L-shaped so that the end of the printed circuit board 1 smoothly contacts the contact rods. The movable support means 9B are secured to the machine body 7, and serve to move the contact rods 9A toward and away from the printed circuit board conveyance passage A—A in directions J. Each movable support means 9B is comprised of a solenoid for moving the contact rod 9A toward the passage A—A, and an elastic member for moving the contact rod 9A away from the passage.

Figure 6:
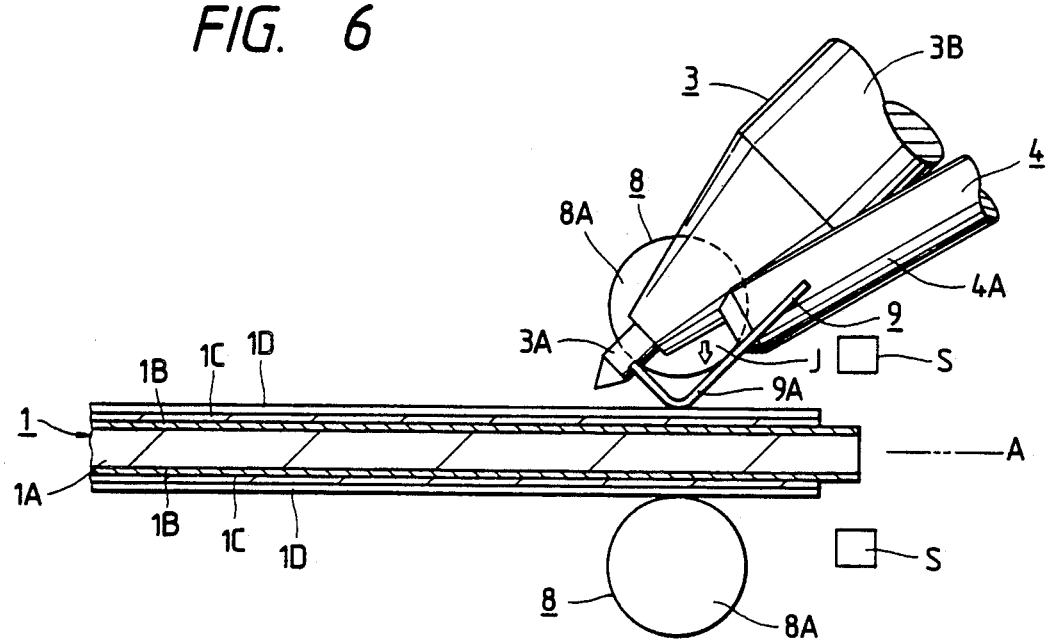
Figure 7:
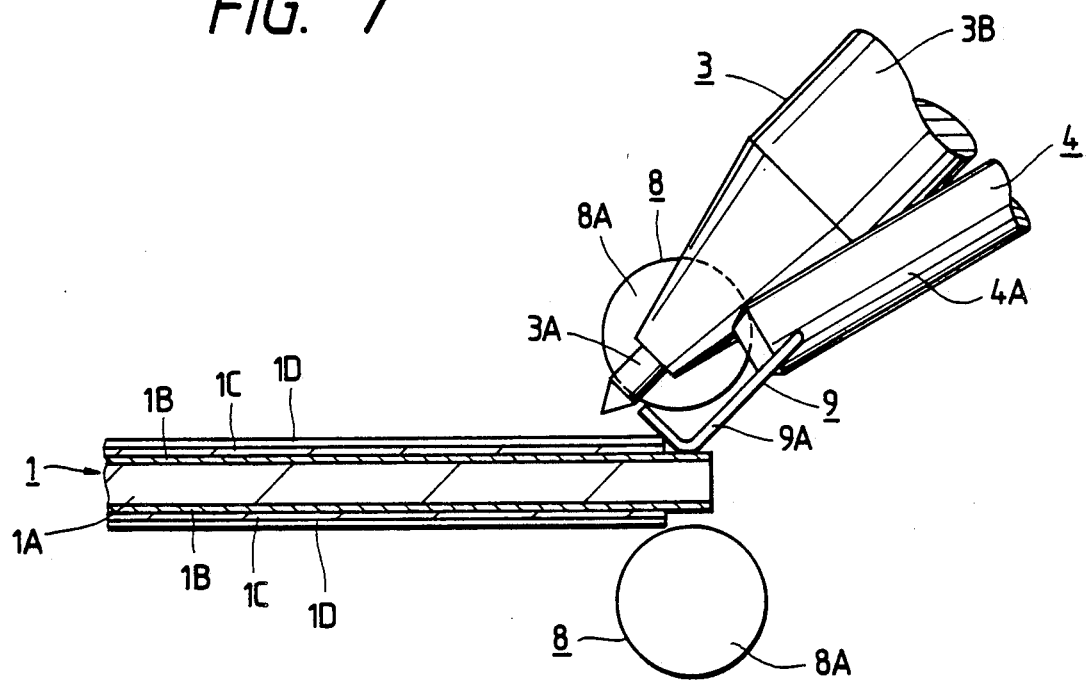
Figure 8:
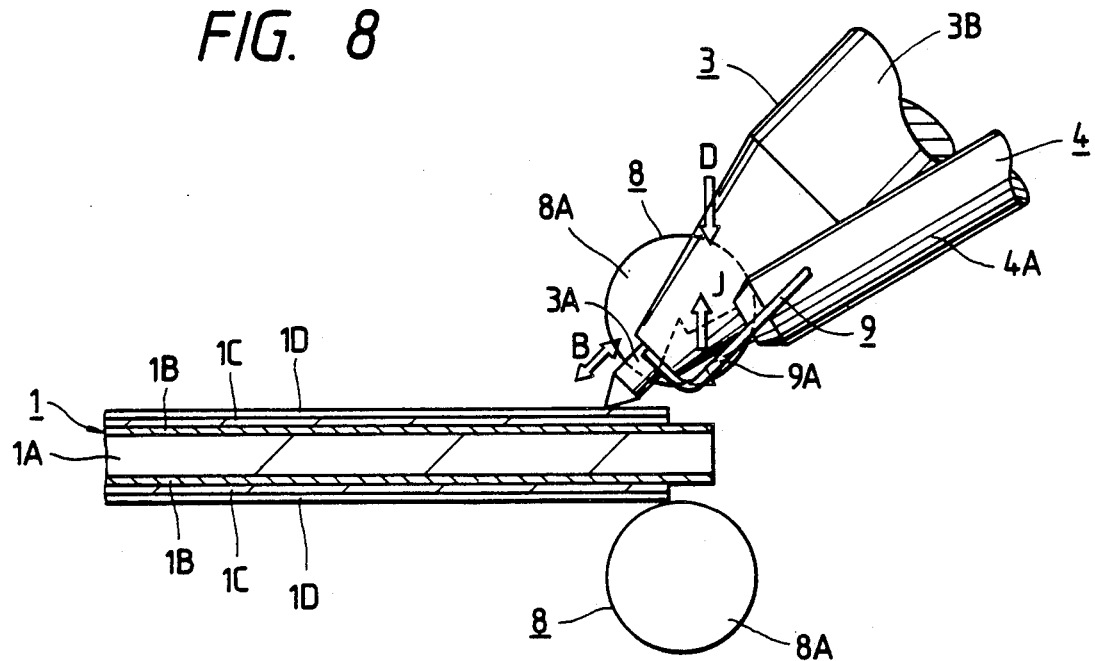
Figure 9:
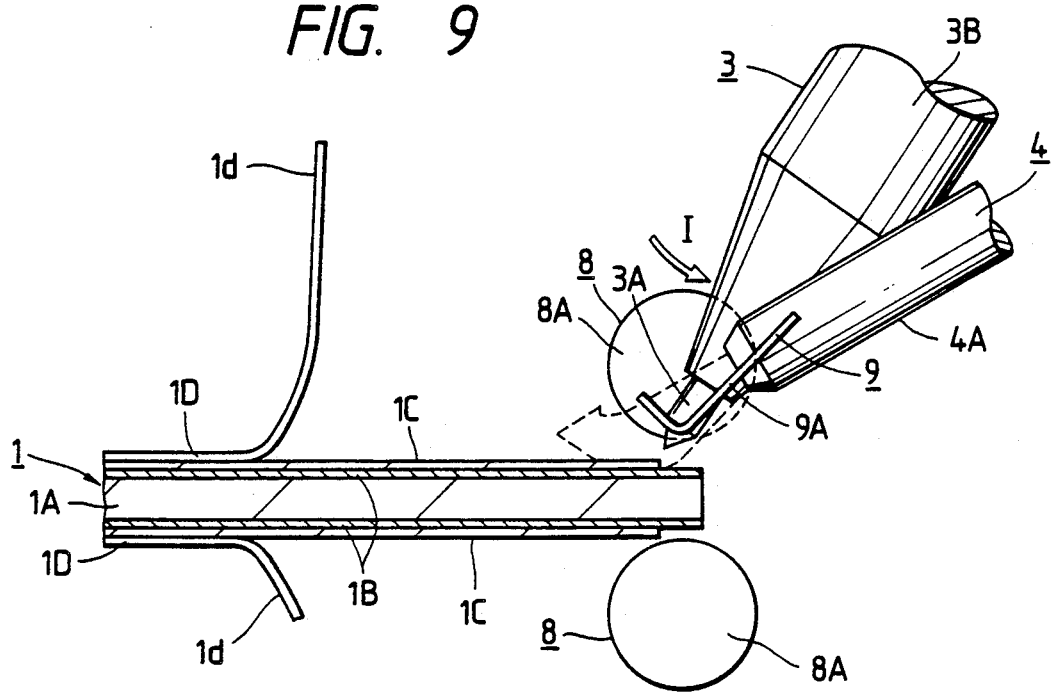

The process of lifting up the end of the cover film 1D from the photosensitive resin layer 1C on the printed circuit board 1 and peeling the cover film from the resin layer are described with reference to FIGS. 2, 3, 4, 5, 6, 7, 8 and 9 from now on. The printed circuit board 1 is conveyed in the printed circuit board conveyance passage A—A in the direction A by the conveyance drive roller 2. When the leading end of the board 1 has passed by the thin film lift-up unit 3 and the fluid blowers 4, the rotation of the roller 2 is stopped so that the conveyance of the board is temporarily ceased on the basis of the action of the transmission-type or reflection-type photosensor S which detects the trailing end of the board. The contact rod 9A of the stratified body end detector 9 is then moved into contact with the surface of the cover film 1D on the printed circuit board 1 in the direction J by the movable support means 9B of the detector to detect the electrostatic capacity or electric resistance of the board, as shown in FIG. 6. Moving the contact rod 9A into contact with the surface of the cover film 1D may be performed substantially simultaneously to the cessation of the conveyance of the board 1, on the basis of a detection signal from the photosensor S. The board 1 is thereafter conveyed backward as the contact rod 9A remains in contact with the cover film 1D. When the trailing end of the cover film 1D approaches the contact rod 9A as shown in FIG. 7, the electrostatic capacity or electric resistance of the rod and the film changes to enable the detection of the trailing end of the cover film. The backward conveyance of the board 1 is then ceased on the basis of a cover film end detection signal. Substantially at the same time, the contact rod 9A is moved out of the conveyance passage A—A, in the direction J, as shown in FIG. 8, and the lift-up members 3A of the thin film lift-up unit 3 are moved into contact with the cover films 1D at the ends thereof while being vibrated in the directions B, as shown in FIG. 8. This movement of the members 3A is caused by moving the shaft 3J of the driver down in the direction F through the linkage mechanism, as shown in FIG. 4, to operate the rotation arm 3H and the movable arms 3G and move the rotary support shafts 3E. The vibration of the members 3A is caused by the pneumatic vibrators 3B. The fluid is blown from the tips of the nozzles $4A_1$ and $4A_2$ of the fluid blowers 4 onto the cover films 1D at the same time that the lift-up members 3A are pushed onto the cover films in a vibratory manner. Each lift-up member 3A is slightly moved by the above-mentioned distance of 1 mm to 3 mm in the direction I while being vibrated, as shown in FIG. 9. The slight movement of the member 3A is performed by moving the shaft 3L of the driver in the direction G (rightward as to FIG. 4) to turn the rotary support shaft 3E in the direction I through the lift-up member rotation mechanism including the lift-up member rotation arm 3K and the coupling member 3M.

THe printed circuit board 1 is pinched by the conveyance drive roller 2 and a board push-down roller 2A is provided over the conveyance drive roller as shown in FIG. 2, to prevent the board from being displaced at the time of the vibratory pushing and slight movement of the lift-up member 3A. For that purpose, the rotation of a motor turning the conveyance drive roller 2 is stopped in accordance with the signal generated as a result of the detection of the leading end of the printed circuit board 1, and a pneumatic or hydraulic cylinder (not shown) is activated at the same time as the stoppage of the rotation of the motor to place the L-shaped braking push plate 2C of a brake mechanism into contact with the board push-down roller 2A to press it to surely pinch the printed circuit board between the rollers 2 and 2A.

The lift-up member 3A of the thin film lift-up unit 3 is vibrated and pushed onto the end of the stratified body consisting of the photosensitive resin layer 1C and the cover film 1D on the printed circuit board 1, to lift-up the cover film at the end thereof from the resin layer to create the gap therebetween. The fluid is then blown into the gap by the fluid blower 4 to peel the cover film from the resin layer as shown at 1d in FIG. 9. The cover film 1D is thus lifted up at the end thereof from the resin layer 1C by using the needle-like lift-up member 3A.

The thin film lift-up unit 3 and the fluid blowers 4 are provided above and below the printed circuit board conveyance passage A—A so that the cover films 1D can be automatically lifted up at the ends thereof from the photosensitive resin layers 1C and peeled therefrom.

A plurality of lift-up members 3A and a plurality of nozzle units 4A may be provided along the width of the printed circuit board 1 in case the stratified body is adhered to the printed circuit board in a distorted state, under heat and pressure.

Although the lift-up members 3A of the thin film lift-up unit 3 are operated by the linkage mechanism, the members may be operated by a rack and pinion mechanism instead. Further, the lift-up members 3A may be made up of adhesive such as adhesive rollers or sharp-pointed members such as needles, brushes and claws.

Figure 10:
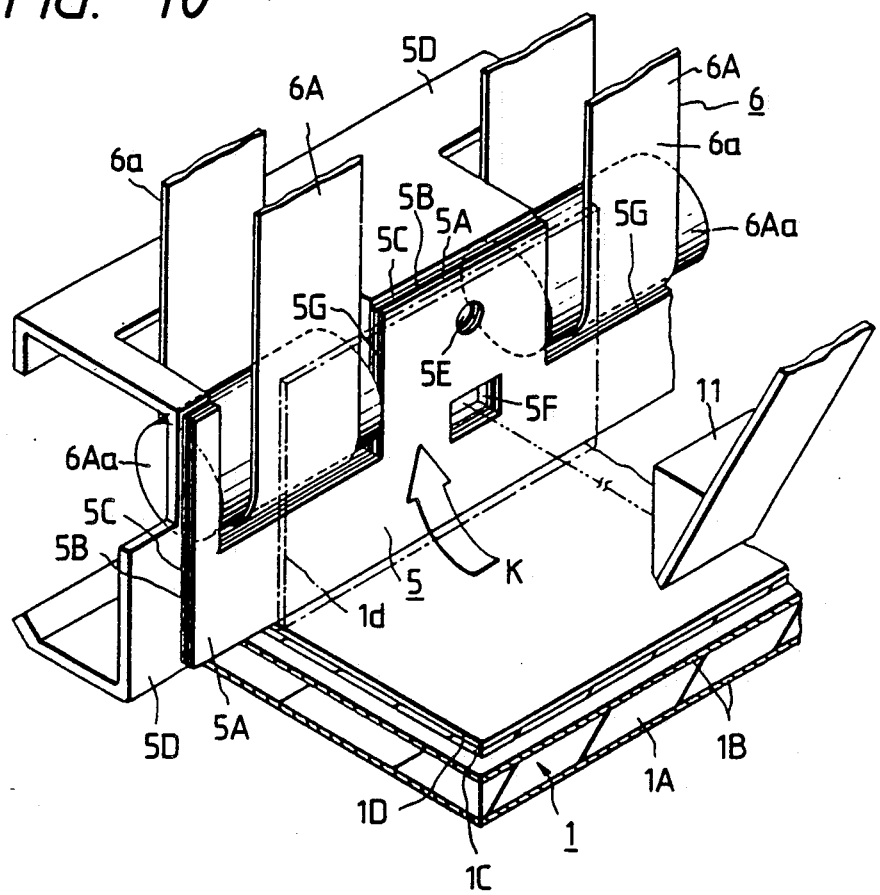
FIG. 10 shows an enlarged perspective view of a major part of the machine.

The cover film 1d peeled from the photosensitive resin layer 1C at the leading end of the printed circuit board 1 by the fluid blower 4 is moved onto the peeling direction setting plate 5 and held thereon by the pressure of the fluid blown from the blower, as shown in FIGS. 2 and 10. The peeling direction setting plate 5 determines the position and angle of the peeling of the cover film 1D and sets the direction of conveyance of the peeled cover film 1d which is conveyed by the thin film conveyor 6 so as to be discharged. The peeled cover film 1d is shown by a single-dot chain lines in FIG. 10. The cover film holding surface of the peeling direction setting plate 5 is such that the angle between the already peeled cover film 1d and the cover film 1D still adhered to the printed circuit board 1 is nearly 90°. In other words, the peeling direction setting plate 5 serves to peel the cover film 1D so that the peeled cover film 1d extends nearly perpendicularly to the surface of the printed circuit board 1. The bottom of the peeling direction setting plate 5, which is located near the position of the peeling of the cover film 1D. is rounded with a small radius of curvature to avoid damaging or destroying the photosensitive resin layer 1C. The radius of curvature is 3 mm or less. The plate 5 is located at such a distance from the cover film 1D on the photosensitive resin layer 1C on the printed circuit board 1 that the cover film does not come into contact with the plate at the time of the conveyance of the board and the peeling of the cover film during the conveyance so as not to damage or destroy the photosensitive resin layer.

The bottom of the upper peeling direction setting plate 5 and the top of the lower peeling direction setting plate 5, which are located near the positions of the peeling of the cover films 1D. are placed into tight contact with the cover films at the time of the lifting-up and peeling thereof so as to pinch the printed circuit board 1. For that purpose, the plates 5 can be moved toward and away from the printed circuit board conveyance passage A—A so as to pinch the printed circuit board 1 by the bottom of the upper plate 5 and the top of the lower plate 5 when the plates are moved toward the passage. In other words, the peeling direction setting plates 5 are moved into or out of contact with the printed circuit board 1 in conjunction with the action of the braking push plate 2C which is pushing the printed circuit board push roller 2A. The plates 5 pinch the printed circuit board 1 while the roller 2A and the conveyance drive roller 2 pinch the board. Since the plates 5 are moved toward the board conveyance passage A—A. the fluid blown from the nozzle units 4A of the fluid blowers 4 is less likely to be directed to the back of the plates. For that reason, the cover films 1D are more surely moved onto the plates 5 and the conveyance belts of the thin film conveyor 6 and held on the plates and the belts. Each peeling direction setting plate 5 has a prescribed length in the direction of the peeling of the cover film 1D. at the entire width of the printed circuit board conveyance passage A—A or that of the stream of the blown-off fluid. Since each peeling direction setting plate 5 is constituted as described above, the fluid blown from the nozzle means 4A as shown by an arrow K in FIG. 10 is less likely to be directed to the back of the plate, so that the cover film 1D is more surely peeled from the photosensitive resin layer 1C and the peeled cover film 1d is more surely moved onto the plate and the conveyance belts and held thereon.

Figure 11:
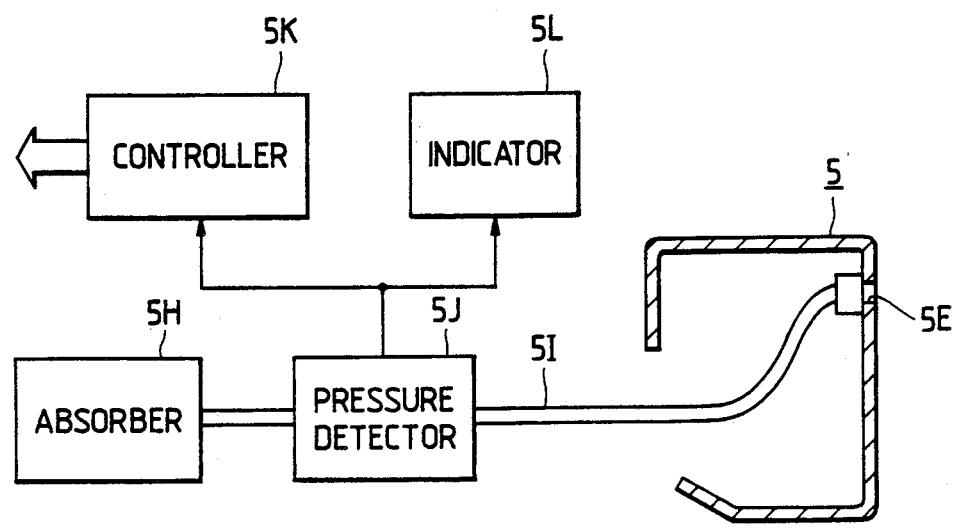
FIG. 11 shows a block diagram of the thin film peeling condition monitoring device of the machine.

As shown in FIG. 10, each peeling direction setting plate 5 comprises an electroconductive portion 5A constituting the cover film holding surface onto which the peeled cover film 1d is held, an electrically insulating portion 5B. another electroconductive portion 5C. and a support portion 5D. The portions 5A. 5B and 5C are secured to the support portion 5D by an adhesive. The electroconductive portions 5A and 5C are shaped as sheets, and made of metal having very low electrical resistance such as copper and stainless steel. The electrically insulating portion 5B is also shaped as a sheet. The support portion 5D is made of a metal such as stainless steel. The electroconductive portion 5A is thus disposed in an electrically : insulated state. When the cover film 1d electrically charged at the time of being peeled from the printed circuit board 1 is held on the electroconductive portion 5A of the peeling direction setting plate 5, an electrostatic force acts between the cover film and the plate so that the power of the holding of the film on the plate is increased. Therefore, the peeled cover film 1d is surely moved onto the thin film holding surface of the plate 5. The plate 5 may comprise only the electroconductive portion 5A and the support portion 5D made of an electric insulator such as resin, so as to dispose of the electroconductive portion in an electrically insulated state on the support portion. The electroconductive portion 5A acts as one of the electrodes of a capacitor. The plate 5 has a thin film suction hole 5E extending through the portions 5A. 5B, 5C and 5D and connected to a vacuum suction unit 5H through a suction pipe 5 as shown in FIG. 11. A suction force is thus applied to the cover film 1d to adhere it to the plate 5 to hold the film thereon. The plate 5 may have a plurality of such thin film suction holes 5E to increase the suctioning force. Since the cover film 1d is thus surely held on the thin film holding surface of the plate 5, the film is surely pinched by the conveyance belts of the thin film conveyor 6 to surely convey the film while peeling it from the photosensitive resin layer 1C. to discharge the film. The thin film suction hole 5E and the vacuum suction unit 5H thus act to surely peel the cover film 1D from the photosensitive resin layer 1C.

The suction pipe 5I connecting the thin film suction hole 5E to the suction unit 5H is provided with a suction pressure detector 5J at a prescribed portion of the pipe to detect the suction pressure for the cover film 1d. For example, the detector 5J is made of an elastic material such as a diaphragm and a bellows. It can be found out through the detector 5J whether or not the peeled cover film 1d is held on the thin film holding surface of the peeling direction setting plate 5. When the suction pressure for the cover film 1d is high enough, the detector 5J sends out a detection signal showing that the film is surely held on the thin film holding surface of the plate 5. When the suction pressure is insufficient, the detector 5J sends out a detection signal showing that the cover film 1d is not securely held on the thin film holding surface. The detection signal from the detector 5J is converted into a pneumatic signal or an electric signal by a differential transformer or the like. The pneumatic signal or the electric signal is then applied to a control circuit 5K or a display unit 5L. The detection signal from the detector 5J may be applied to the control circuit 5K or the display unit 5L through a linkage mechanism. The detector 5J. the circuit 5K or the display unit 5L constitute a thin film peeling condition monitoring device. As shown in FIG. 1, the control circuit 5K is provided at the central portion of the body 7 of the cover film peeling machine and the display unit 5L is provided at the upper portion of the machine body 7 so as to be easily seen by the person operating the machine The control circuit 5K regulates the rotation of the conveyance drive roller 2 and the peeling of the cover film 1D on the basis of the detection siqnal from the suction pressure detector 5J. When the control circuit 5K has received the detection signal indicating that the cover film 1d is not properly peeled, the circuit acts to place the thin film conveyor 6 out of action and causes the conveyance drive roller 2 to convey the defective printed circuit board 1 to a prescribed place where the board can be removed out of the printed circuit board conveyance passage A—A by a defective board remover 18 so as not to be conveyed to a developing machine provided next to the cover film peeling machine.

The display unit 5L is made of a sounding device such as a buzzer or a light emitter such as a lamp. The display unit 5L can give the operating person a signal to remove the defective printed circuit board from the passage A—A to prevent the board from being conveyed to the developing machine.

It is preferable that a plurality of thin film suction holes 5E are provided in the thin film holding surface of the peeling direction setting plate 5 and thin film peeling condition monitoring devices are provided at the holes, respectively, in order to enhance the accuracy of monitoring of the condition of peeling of the cover film 1d.

Since the defective printed circuit board from which the cover film 1D has failed to be properly peeled can be removed from the printed circuit board conveyance passage A—A so as not to be conveyed to the developing machine, as described above, the board can be used again to improve the yield of production of finished printed circuit boards.

As shown in FIG. 10, the thin film holding surface of the peeling direction setting plate 5 has a thin film peeling condition monitoring hole 5F extending through the plate. Light emitted from a photosensor 11 proceeds through the monitoring hole 5F to determine whether or not the cover film 1d is being held on the thin film holding surface of the plate 5. When the monitoring hole 5F is closed with the cover film 1d, the light is reflected by the film and detected by the photosensor 11 to regard the film as being held on the thin film holding surface of the plate 5. The defective printed circuit board 1 which has not been confirmed by the monitoring hole 5F and the photosensor 11 indicating that the cover film is not held on the thin film holding surface of the plate, is removed from the printed circuit board conveyance passage A—A. The photosensor 11 is made of the reflection type or the transmission type, and attached to the machine body 7 as shown in FIG. 3.

Since the peeling direction setting plate 5 serves to stabilize the position of the peeling of the cover film 1D and apply a uniform peeling force to the film, the fluctuation in the position of the peeling and the nonuniform distribution of peeling stress in the film are prevented to keep the photosensitive resin layer 1C from being damaged or destroyed.

Depending on conditions such as the material of the cover film 1D. the pressure of the fluid from the fluid blower 4 and the speed of the conveyance of the printed circuit board 1, the thin film holding surface of the peeling direction setting plate 5 may be designed such that the angle between the still-unpeeled cover film 1D and the already-peeled cover film 1d is obtuse. Besides, the direction of the thin film holding surface of the plate 5 may be changed by a driver such as a pneumatic cylinder. The position or direction of each of the fixed conveyance belt units of the thin film conveyor 6 may be altered depending on the change in the direction of the thin film holding surface of the plate 5.

The thin film holding surface of the peeling direction setting plate 5 may be provided with a plurality of grooves extending across the direction of the conveyance of the printed circuit board 1 or extending in the same direction as the already-peeled cover film 1d, and a plurality of thin film suction holes 5E may be provided in the thin film holding surface and the bottoms of the grooves and connected to vacuum suction units. With this constitution, the peeled cover film 1d can be surely moved onto the thin film holding surface of the plate 5 and held thereon, and thereafter instantaneously separated from the surface so as to be transferred to the thin film conveyor 6 and surely conveyed thereby.

The cover film 1d moved onto the thin film holding surface of the plate 5 and held thereon by the fluid blower 4 in advance is completely peeled from the photosensitive resin layer 1C while being conveyed by the thin film conveyor 6 shown in FIGS. 1. 2 and 12, so that the film is discharged. Simultaneously, the plate 5 determines the position of the peeling of the cover film 1D, and assists the peeling.

As shown in FIG. 2, the thin film conveyor 6 is chiefly composed of an upper section provided over the printed circuit board conveyance passage A—A, and a lower section provided under the passage. The upper section comprises a first thin film conveyance means 6A and 6B and a second thin film conveyance means 6D. The first thin film conveyance means includes a fixed conveyance belt unit 6A and a movable conveyance belt unit 6B. The fixed conveyance belt unit 6A comprises rollers 6Aa supported on the driven shaft, rollers 6Ab supported on another drive shaft, rollers 6Ac supported on a driving shaft, and belts 6a wound on the rollers. The movable conveyance belt unit 6B comprises rollers 6Ba supported on a driven shaft, rollers 6Bb supported on another driven shaft, rollers 6Bc supported on a driving shaft, and belts 6b wound on the rollers. As shown in FIG. 2, the rollers 6Ba can be rotated in a direction L about the driven shaft supporting the rollers, to easily move the peeled cover film 1d onto the peeling direction setting plate 5 and hold the film thereon and to pinch the film between the fixed and the movable conveyance belt units 6A and 6B. The cover film 1d held on the thin film holding surface of the plate 5 is pinched by the belts 6a of the fixed conveyance belt unit 6A and those belts 6b of the movable conveyance belt unit 6B so that the film is conveyed upward nearly perpendicularly to the surface of the printed circuit board 1 by the belt units while being peeled further from the board. The cover film 1d is pinched between the fixed and the movable conveyance belt units 6A and 6B and notches 5G provided in the peeling direction setting plate 5, as shown in FIG. 10. The notches 5G serve so that the fixed and the movable conveyance belt units 6A and 6B can reach the cover film 1d, of which the position and direction of the peeling and the angle of the peeling to the surface of the printed circuit board 1 are set by the peeling direction setting plate 5, and the belt units can surely pinch the cover film.

The cover film 1d, pinched and conveyed by the fixed and movable conveyance belts 6A and 6B, is guided in a direction M by guide members 6Ca and 6Cb so that the film is conveyed to the second thin film conveyance means 6D. The guide members 6Ca and 6Cb act to change the direction of the conveyance of the cover film 1d from being vertical to being horizontal, to convey the cover film in a direction parallel with the printed circuit board conveyance passage A—A but inverse to the direction A of the conveyance of the printed circuit board 1. Each of the guide members 6Ca and 6Cb is shaped as a rod to minimize the area of contact between the guide member and the cover film 1d. A plurality of guide members 6Ca and 6Cb are provided along directions extending across the printed circuit board conveyance passage A—A. The guide members 6Ca and 6Cb are made of an electroconductive material such as stainless steel to remove static electricity generated on the cover film at the time of the peeling or conveyance thereof. However, the guide members 6Ca and 6Cb may be made of an electrically insulating material such as resin. The guide members 6Ca and 6Cb act to prevent the cover film 1d from being involved by the rollers 6Ac and 6Bc of the fixed and the movable conveyance belt units 6A and 6B when the cover film 1d is conveyed from the first thin film conveyance means 6A and 6B to the second thin film conveyance means 6D.

As shown in FIG. 2, fluid ejectors 12 and an electricity remover 15 are provided near the guide members 6Ca and 6Cb. The fluid ejector 12 provided near the guide members 6Ca ejects a fluid in a direction N, while the other fluid ejector 12 provided near the guide members 6Cb ejects a fluid in a direction O. The ejected fluids flow along both sides of the cover film 1d conveyed by the first thin film conveyance means 6A and 6B, so that the film is smoothly conveyed to the second thin film conveyance means 6D and is prevented from being effected by the rollers 6Ac and 6Bc of the fixed and the movable conveyance belt units 6A and 6B when being conveyed from the first thin film conveyance means 6A and 6B to the second thin film conveyance means 6D. The electricity remover 15 reduces static electricity generated on the cover film 1d at the time of the peeling or conveyance thereof.

After the cover film 1d is conveyed from the first thin film conveyance means 6A and 6B to the second thin film conveyance means 6D, the film is conveyed out by the second thin film conveyance means, as shown in FIGS. 1, 2, 12 and 13. The second thin film conveyance means 6D comprises a base 6Da, thin film guide members 6Db and 6Dc and a fluid blowing nozzle 6Dd. The base 6Da is provided on the machine body 7 and located in a position, to the vicinity of which the cover film 1d is conveyed in the direction M by the first thin film conveyance means 6A and 6B.

The base 6Da is made of a metal plate such as stainless steel or a synthetic resin, and has a surface parallel to the printed circuit board conveyance passage A—A and having a major edge extending across the passage nearly perpendicularly thereto.

Figure 13:
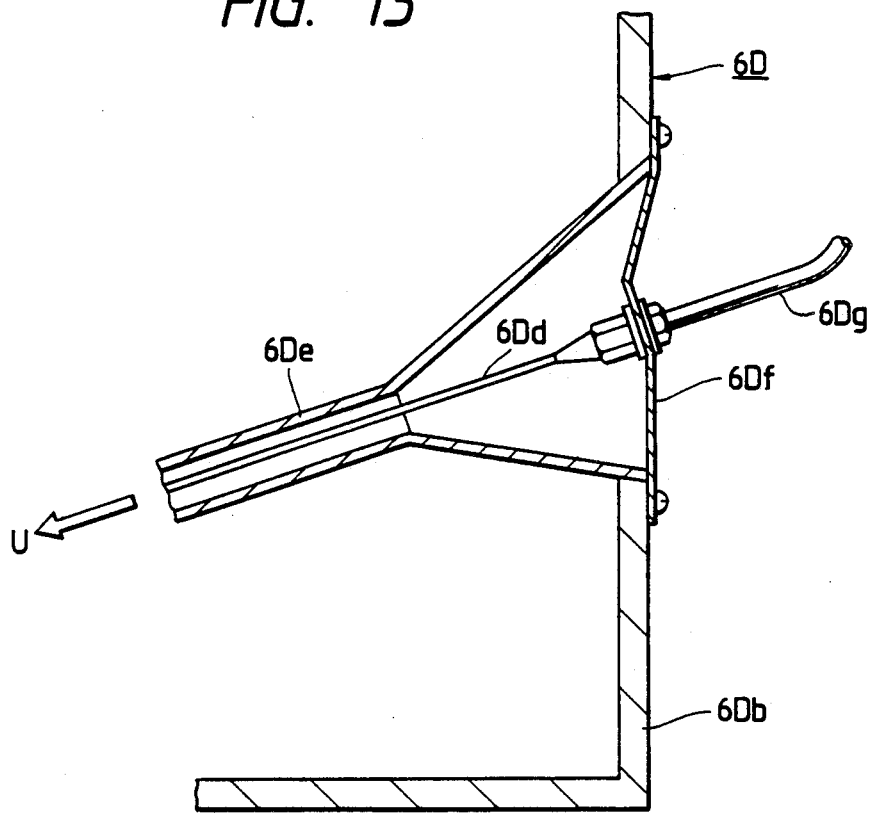
FIG. 13 shows an enlarged sectional view of the fluid blowing nozzle of the machine.
Figure 12:
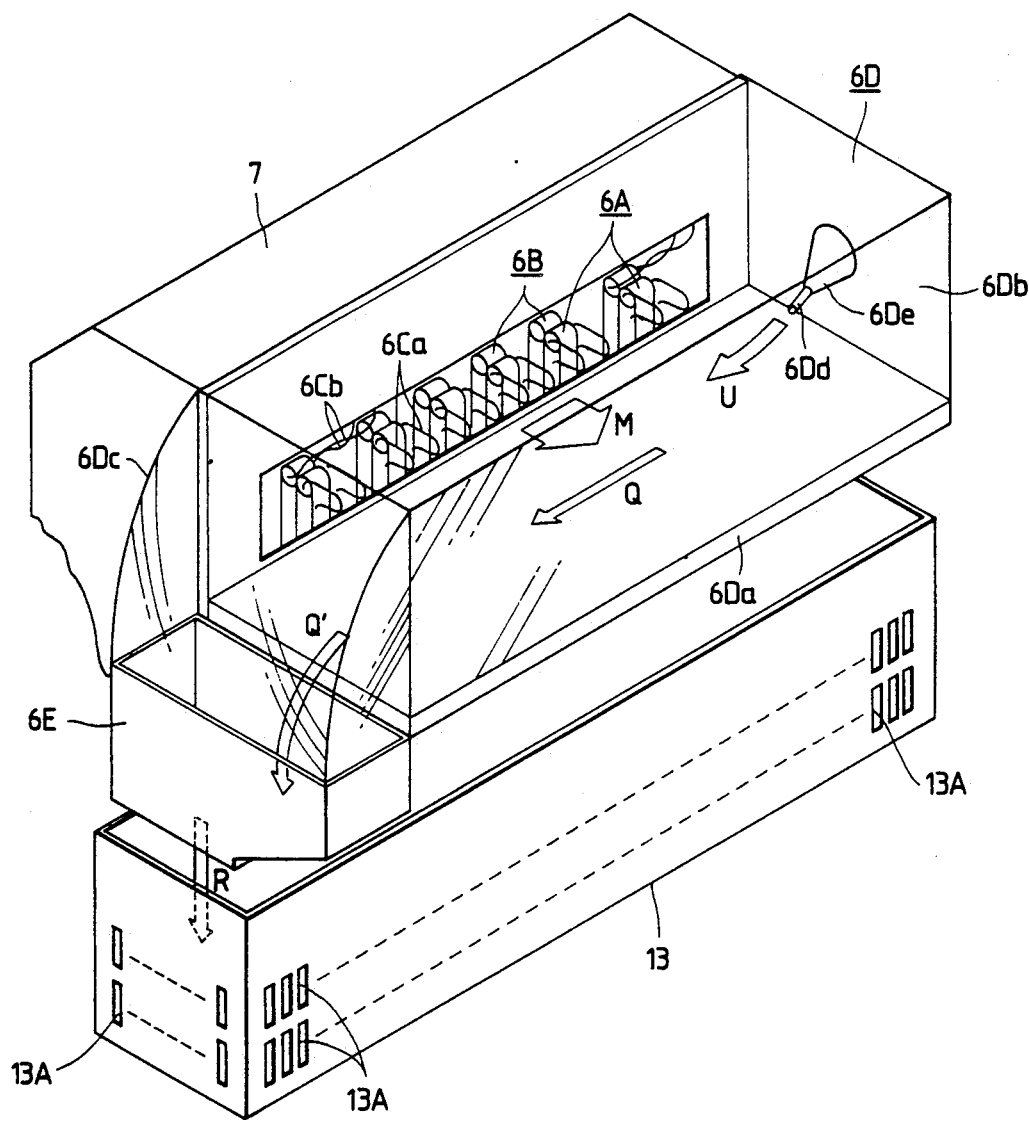
FIG. 12 shows an enlarged perspective view of a major part of the thin film conveyor of the machine.
Figure 14:
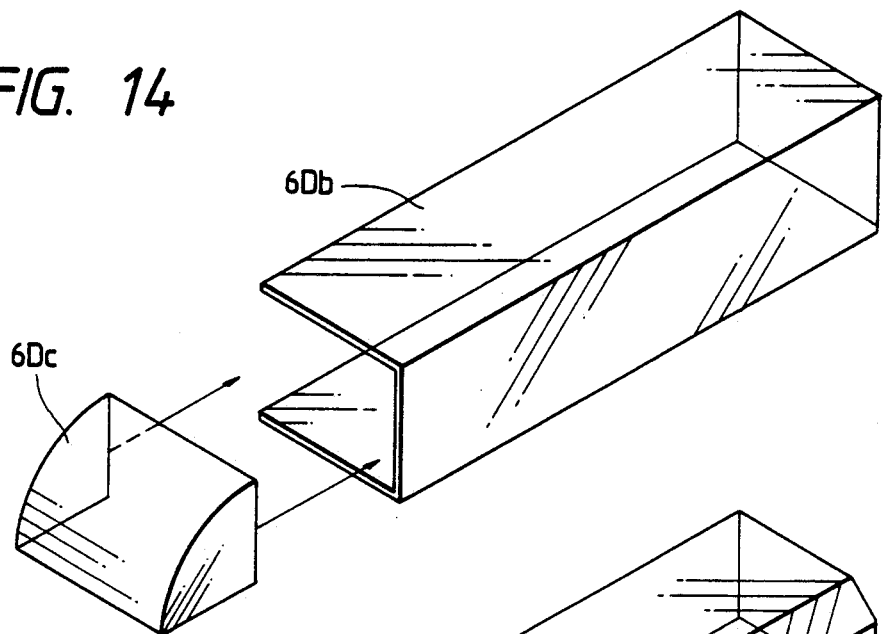
FIG. 14 shows a perspective view of the thin film guide member of the machine.
Figure 15:
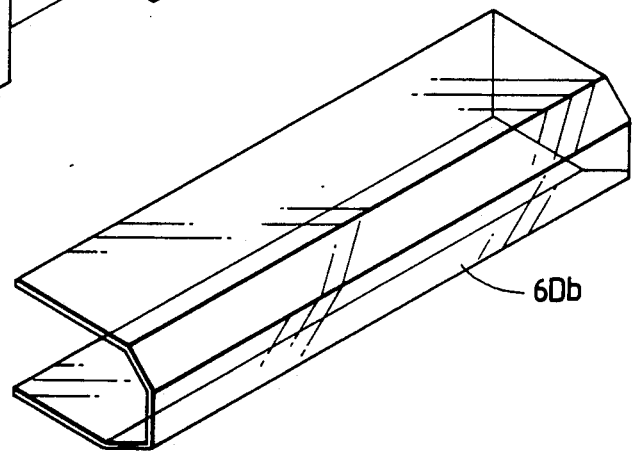
FIGS. 15 and 16 show perspective views of modifications of the thin film guide member.
Figure 16:
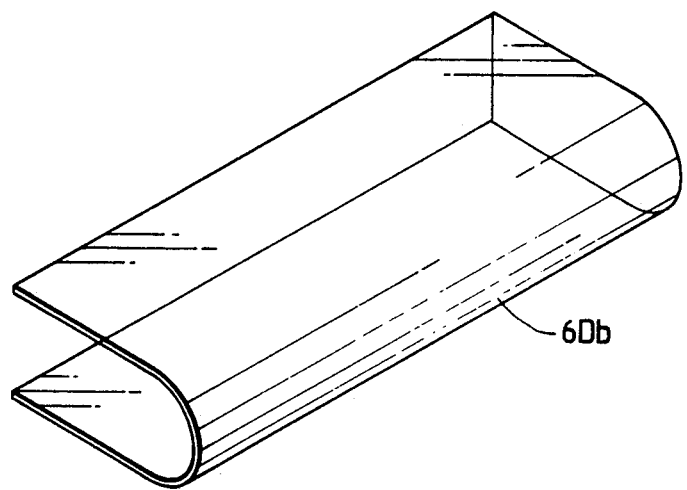

The thin film guide member 6Db acts to determine the horizontal direction Q of conveyance of the cover film 1d. As shown in FIGS. 12, 13 and 14, the thin film guide member 6Db is shaped as a rectangular parallelepiped and disposed on the base 6Da. The other thin film guide member 6Dc is attached to one side of the thin film guide member 6Db, and acts to change the direction of conveyance of the cover film 1d from horizontal to vertical as shown by an arrow Q'. The thin film guide member 6Db is shaped as a sectorial box. The thin guide members 6Db and 6Dc are made of a transparent synthetic resin or the like so that the operator can monitor the condition of conveyance of the cover film 1d in the guide members. However, the guide members 6Db and 6Dc may be made of an opaque synthetic resin or light alloy. The guide 6Db and 6Dc extend to surround nearly the entire cover film 1d conveyed into the guide members by the first thin film conveyance means 6A and 6B. The thin film guide member 6Db is not confined to the rectangular parallelepiped form shown in FIG. 14, but may be shaped as a polygon or curved as shown in FIGS. 15 and 16. Although the function of the thin film guide member 6Db shaped as shown in FIGS. 15 and 16 is not substantially different from that of the thin guide member shaped as shown in FIG. 14, it is slightly more difficult to manufacture the member to the form shown in FIGS. 15 and 16 than to the form shown in FIG. 14.

As shown in FIGS. 12 and 13, the fluid blowing nozzle 6Dd blows a fluid in a direction U to the cover film 1d conveyed by the first thin film conveyance means 6A and 6B, to convey the film in direction Q and Q'. The nozzle 6Dd is connected to a fluid source such as a compressor through a fluid feed pipe 6Dg. The nozzle 6Dd is made of a metal, and the pipe 6Dg is made of a rubber of synthetic resin, for example. The nozzle 6Dd is attached with a nozzle support member 6Df to another side of the thin film guide member 6Db, which is located opposite the other thin film guide member 6Dc. The nozzle 6Dd is secured to the support member 6Df by a bolt, a nut and a washer. A nozzle reinforcing member 6De is provided around the slender nozzle 6Dd to mechanically reinforce it. The reinforcing member 6De is made of a metal or a resin, and is shaped as a funnel but not confined thereto. The fluid blown from the nozzle 6Dd is pressurized air which may be supplied from the same fluid source as the fluid blowers 4. Since the pressurized air does not need to be recovered like a liquid such as water, the constitution of a fluid blowing means including the nozzle 6Dd is simple. Although the pressurized air is not appropriate as the fluid, a liquid such as water or an inert gas may be used as the fluid.

Figure 17:
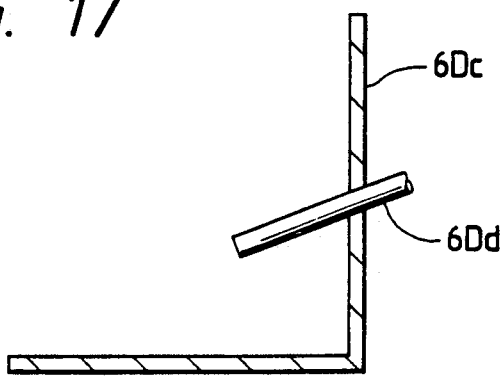
FIG. 17 shows a sectional view of the fluid blowing nozzle.
Figure 18:
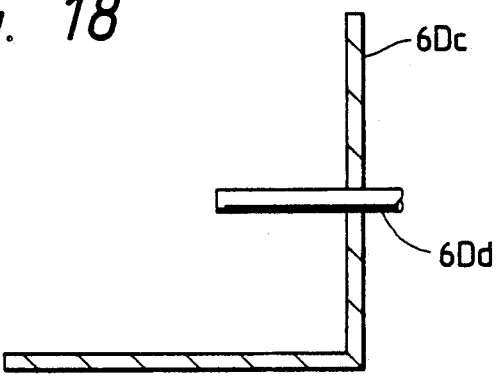
FIGS. 18 and 19 show sectional views of modifications of the nozzle.
Figure 19:
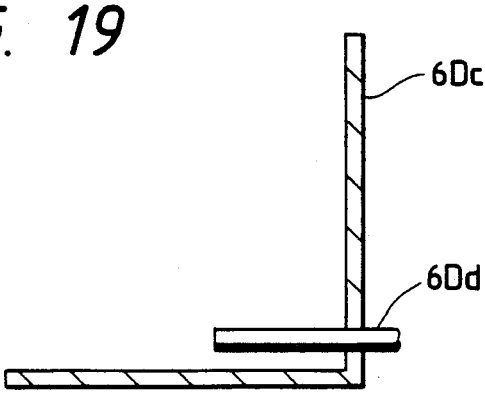

As shown in FIGS. 12, 13 and 17, the fluid blowing nozzle 6Dd is attached to the central portion of the side of the thin film guide member 6Db in such a manner that the tip of the nozzle is oriented obliquely downward. As a result, the efficiency of the conveyance of the cover film 1d is higher than in the case that the tip of the nozzle 6Dd is oriented as shown in FIG. 18 or 19. In the case shown in FIG. 18, the nozzle 6Dd is attached to the central portion of the side of the guide member 6Db, and the tip of the nozzle is horizontally oriented. In the case shown in FIG. 19, the nozzle 6Dd is attached to the lower portion of the side of the guide member 6Db, and the tip of the nozzle is horizontally oriented. Although the single fluid blowing nozzle 6Dd is provided in this embodiment, a plurality of such nozzles may be provided on the side of the thin film guide member 6Db or along the conveyance passage for the cover film 1d. Since the fluid is blown from the nozzle 6Dd to the cover film 1d in the direction U, the film is conveyed in the directions Q and Q' more rapidly than it is conveyed by a belt means.

The second thin film conveyance means 6D is located over the printed circuit board conveyance passage A—A, upstream to the position of the peeling of the cover film 1D or the position of the peeling direction setting plate 5, so that an extraneous substance clinging to the peeled cover film 1d or an extraneous substance coming from the second thin film conveyance means 6D is less likely to cling to the surface of the photosensitive resin layer 1C from which the cover film is already peeled. Since the second film conveyance means 6D is located as described above, it is easy to perform maintenance work on the thin film lift-up unit 3, the fluid blower 4, a defective printed circuit board remover 18 and so forth, which are provided downstream to the position of the peeling of the cover film 1D.

The cover film 1d conveyed in the directions Q and Q' by the second thin film conveyance means 6D is discharged in a direction R through a discharge guide member 6E provided at a side of the printed circuit board conveyance passage A—A. The discharged cover film 1d is placed into a discharged thin film container 13 extending across the passage A—A and slightly overhanging it. The guide member 6E serves to define the discharge passage for the cover film 1d so as to discharge it down into the container 13 within a minimized space. The guide member 6E is made of stainless steel, but not confined thereto.

The discharged thin film container 13 is shaped as a rectangular parallelepiped, and extends across the printed circuit board conveyance passage A—A. The container 13 has such size and form that not only the cover film 1d conveyed by the upper thin film conveyor section but also the cover film 1d conveyed by the lower thin film conveyor section, which is the third thin film conveyance means of the thin film conveyor, are discharged into the container. The container 13 is made of a lightweight metal such as an aluminum alloy, a metal such as stainless steel, resin, wood or the like. The walls of the container 13 have oblong air outlet openings 13A for releasing the air out of the container when the cover film 1d is discharged into the container. However, the openings 13A may be circularly shaped.

As shown in FIG. 2, the lower section of the thin film conveyor 6 includes a fixed conveyance belt unit 6F and a movable conveyance belt unit 6G. The fixed conveyance belt unit 6F comprises rollers 6Fa and 6Fb supported on driven shafts, respectively, rollers 6Fc supported on a driving shaft, and belts 6f wound on the rollers. The movable conveyance belt unit 6G comprises rollers 6Ga and 6Gc supported on driven shafts, respectively, rollers 6Gb supported on a driving shaft, and belts 6g wound on the rollers. The movable conveyance belt unit 6G can be rotated as shown by an arrow in FIG. 2. The lower thin film conveyor section conveys the lower cover film 1d while peeling it from the lower photosensitive resin layer 1C on the printed circuit board 1 for which the position and direction of the peeling of the film are set by the lower peeling direction setting plate 5, and discharges the film downward in a direction S.

The belts 6a and 6B of the upper thin film conveyor section and those 6f and 6g of the lower thin film conveyor section are toothed rubber belts. The rollers 6Aa, 6Ab, 6Ac, 6Ba, 6Bb, 6Bc, 6Fa, 6Fb, 6Fc, 6Ga, 6Gb and 6Gc of the upper and the lower thin film conveyor sections are toothed pulleys. Therefore, the belts are surely revolved. The belts and the rollers may be toothless rubber belts having rough surfaces for high friction, and toothless rollers having rough surfaces having reticulate thin grooves or the like, respectively.

As shown in FIG. 2, a fluid ejector 12, which ejects a fluid to the lower cover film 1d in the direction of the discharge thereof is provided near a cover film conveyance passage defined by the discharge portions of the fixed and the movable conveyance belt units 6F and 6G. The fluid ejector 12 is made of a pipe having a fluid ejection port. Gas such as pressurized air and inert gas is used as the fluid. A liquid such as water may be used as the fluid.

As shown in FIG. 2, an electricity remover 15 and an ion diffuser 16 are provided near the fixed and the movable conveyance belt means 6A and 6G. The electricity remover 15 emits ions to reduce the electrification of the cover film 1d at the time of the peeling or conveyance thereof. The ion diffuser 16 diffuses the ions emitted from the electricity remover 15, to efficiently reduce the electrification of the cover film 1d. The ion diffuser 16 diffuses the ions by a fluid such as pressurized air.

As mentioned above, a portion of the cover film 1D adhered to the photosensitive resin layer 1C on the printed circuit board 1 is peeled from the resin layer, and the peeled cover film 1d is discharged into the container 13. The first thin film conveyance means 6A and 6B pinches the peeled portion of the cover film 1d to peel the entire cover film from the resin layer 1C and convey the film upward over the printed circuit board 1. The second thin film conveyance means 6D then conveys the cover film 1d by blowing the fluid to the film, so that the film moves in a direction extending across the printed circuit board conveyance passage A—A. Since the length of, the pinched cover film conveyance passage in the first thin film conveyance means 6A and 6B is reduced by the length of the second thin film conveyance means 6D, the cover film is less likely to undergo improper conveyance such as jamming in the discharge passage for the film. Besides, the second thin film conveyance means 6D is primarily made of fluid blowing nozzle 6Dd so that the means does not include a large number of components such as a roller and a belt. For that reason, the number of components of the second thin film conveyance means 6D is diminished, and the constitution of the device is simplified. This results in decreasing the cost of production of the cover film peeling machine and simplifying the maintenance work thereon.

Since the second thin film conveyance means 6D is located over the printed circuit board conveyance passage A—A. upstream to the position of the peeling of the cover film 1D. the extraneous substance clinging to the peeled cover film 1d or that coming from the second thin film conveyance means 6D is less likely to cling to the surface of the photosensitive resin layer 1C on the printed circuit board 1. For that reason, the yield in the production of the finished printed circuit board 1 is improved.

Since the discharged thin film container 13, into which the cover film 1d conveyed by the second thin film conveyance means 6D is discharged, is provided at the side of the printed circuit board conveyance passage A—A under it, it is easy to handle the container to perform the dumping of the discharged cover film or do the like. Since not only the upper peeled cover film but also the lower peeled cover film are discharged into the container 13, the size of the cover film peeling machine is smaller than in the case that the upper and the lower peeled cover films would be discharged into separate containers, respectively.

As shown in FIG. 1, a centering unit 17 for causing the width center line of the printed circuit board conveyance passage A—A and that of the printed circuit board 1 to coincide with each other is provided at the printed circuit board conveyance passage, upstream to the position of the peeling of the cover film 1D.

As shown in FIG. 1, the defective printed circuit board remover 18 for removing the defective printed circuit board 1 from the conveyance passage A—A in a direction T to put the board into a discharge section 18A is provided at the passage, downstream to the position of the peeling of the cover film 1D.

Figure 20:
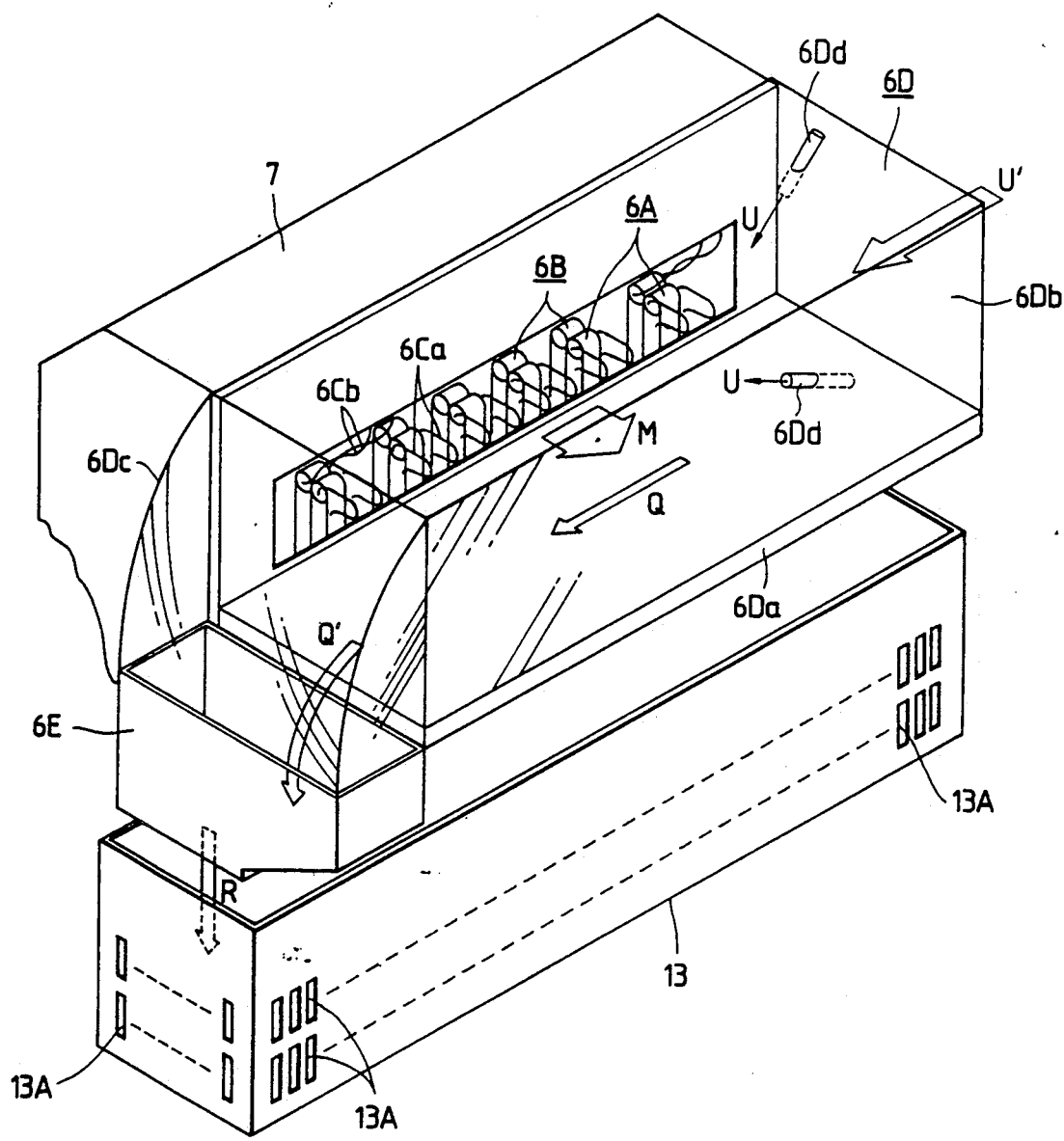
FIG. 20 shows a perspective view of the second thin film conveyance means of a thin film peeling machine which is another embodiment of the present invention.

FIG. 20 shows the second thin film conveyance means 6D of a cover film peeling machine which is the other one of the embodiments. The second thin film conveyance means 6D includes fluid blowing nozzles 6Dd provided at the top and bottom of a thin film guide member 6Db or at the front and rear thereof. The side of the thin film guide member 6Db, which is located behind the nozzles 6Dd, is open, so that air is suctioned into the guide member in a direction U' as a fluid is blown off from the nozzles in directions U. For that reason, the conveyance of a cover film 1d, which is performed by blowing the fluid from the nozzles 6Dd, is accelerated. Since the side of the guide member 6Db is open, the number of the components of the member is diminished and the constitution of the member is simplified and the cover film 1d jammed in the member can be easily removed therefrom and the maintenance work on the member is facilitated.

The present invention is not confined to the above-described embodiments, but may be embodied or practiced in other various ways without departing from the spirit or essential character thereof. For example, the present invention may be embodied as a machine for peeling a protective film from an ornamental building material.

According to the present invention, a thin film peeling machine, in which a thin film is made less likely by a simple construction to undergo improper conveyance and a thin film container, into which a thin film is discharged, can be efficiently handled, is provided.

What is claimed is:

1. A thin film peeling apparatus in which a portion of a thin film adhered to a base plate is initially lifted an subsequently peeled therefrom, said film peeling apparatus comprising:

base plate conveying means for conveying said base plate along a base plate conveyance passage;

a first thin film conveyance means for conveying said lifted portion of said thin film, said first thin film conveyance means being disposed so as to peel said thin film in a direction substantially perpendicular to a direction of conveyance of said base plate, said first thin film conveyance means conveying only said thin film;

a second thin film conveyance means for subsequently conveying said thin film in a direction parallel to the surface of said base plate and substantially perpendicular to the direction of conveyance of said base plate.

2. The peeling apparatus according to claim 1, wherein said second conveyance means comprises at least one fluid ejector.

3. The thin film peeling apparatus according to claim 2, wherein said fluid ejected by said at least one ejector comprises air.

4. The thin film peeling apparatus according to claim 2, wherein said second thin film conveyance means further comprises a thin film guide member for guiding said thin film in the appropriate direction.

5. The thin film peeling apparatus according to claim 4, wherein said thin film guide member comprises a transparent material.

6. The thin film peeling apparatus according to claim 2, wherein said second thin film conveyance means is disposed above the conveyance passage of said base plate and upstream of the position in Which said thin film is initially peeled.

7. The thin film peeling apparatus according to claim 2, further comprising a discharge container disposed at a side of the conveyance passage of said base plate into which said thin film conveyed by said second thin film conveyance means is discharged.

8. The thin film peeling apparatus according to claim 2, wherein said fluid ejected by said at least one ejector comprises water.

9. The thin film peeling apparatus according to claim 2, wherein said fluid ejected by said at least one ejector comprises an inert gas.

* * * * *